(12) United States Patent
Hackler et al.

(10) Patent No.: US 7,491,003 B2
(45) Date of Patent: Feb. 17, 2009

(54) METHOD AND APPARATUS FOR THERMAL DEVELOPMENT WITH VAPOR TREATMENT

(75) Inventors: Mark A. Hackler, Ocean, NJ (US); James J. Grant, III, Lincoln University, PA (US); Bernard F. Hoff, Farmington, NY (US); Carmo Joseph Pereira, Silver Spring, MD (US); Wilford Shamlin, Newark, DE (US); Thomas A. Simpson, Hockessin, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 232 days.

(21) Appl. No.: 11/409,609

(22) Filed: Apr. 24, 2006

(65) Prior Publication Data

US 2007/0248912 A1    Oct. 25, 2007

(51) Int. Cl.
*G03D 13/00* (2006.01)
*G03F 7/12* (2006.01)

(52) U.S. Cl. .................. 396/575; 430/254; 430/306
(58) Field of Classification Search ............... 396/575; 430/254
See application file for complete search history.

(56) References Cited

U.S. PATENT DOCUMENTS

| | | | |
|---|---|---|---|
| 3,060,023 A | 10/1962 | Burg et al. | |
| 3,264,103 A | 8/1966 | Cohen et al. | |
| 4,415,533 A | 11/1983 | Kurotori et al. | |
| 5,015,556 A | 5/1991 | Martens | |
| 5,175,072 A | 12/1992 | Martens | |
| 5,215,859 A | 6/1993 | Martens | |
| 5,279,697 A | 1/1994 | Peterson et al. | |
| 6,797,454 B1 | 9/2004 | Johnson et al. | |
| 6,996,352 B2 | 2/2006 | Choi et al. | |
| 6,998,218 B2 | 2/2006 | Markhart | |
| 2004/0105697 A1 | 6/2004 | Choi et al. | |
| 2005/0084791 A1 | 4/2005 | Hackler et al. | |
| 2005/0241509 A1 | 11/2005 | Gotsick et al. | |

FOREIGN PATENT DOCUMENTS

| | | |
|---|---|---|
| EP | 0 469 735 A2 | 2/1992 |
| WO | WO 98/13730 A1 | 4/1998 |
| WO | WO 01/18604 A2 | 3/2001 |

*Primary Examiner*—William B. Perkey
(74) *Attorney, Agent, or Firm*—Thomas H. Magee

(57) ABSTRACT

This invention pertains to a method and apparatus for thermally developing a photosensitive element. The photosensitive element includes a composition layer capable of being partially liquefied upon heating. Heating the layer causes one or more organic compounds in the layer to form a vapor. Oxidation of the vapor forms carbon dioxide and water vapor and reduces the need to manage waste streams containing the organic compounds.

59 Claims, 1 Drawing Sheet

METHOD AND APPARATUS FOR THERMAL DEVELOPMENT WITH VAPOR TREATMENT

BACKGROUND OF THE INVENTION

1. Field of the Disclosure

This invention pertains to a method and apparatus for treating a photosensitive element, and particularly to a method and apparatus for thermally treating a photosensitive element.

2. Description of the Related Art

Flexographic printing plates are well known for use in printing surfaces which range from soft and easy to deform to relatively hard, such as packaging materials, e.g., cardboard, plastic films, aluminum foils, etc. Flexographic printing plates can be prepared from photosensitive elements containing photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, photopolymerization of the photopolymerizable layer occurs in the exposed areas, thereby curing and rendering insoluble the exposed areas of the layer. Conventionally, the element is treated with a suitable solution, e.g., solvent or aqueous-based washout, to remove the unexposed areas of the photopolymerizable layer leaving a printing relief which can be used for flexographic printing. However, developing systems that treat the element with a solution are time consuming since drying for an extended period (0.5 to 24 hours) is necessary to remove absorbed developer solution.

As an alternative to solution development, a "dry" thermal development process may be used which removes the unexposed areas without the subsequent time-consuming drying step. In a thermal development process, the photosensitive layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. No. 3,060,023 (Burg et al.); U.S. Pat. No. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). The exposed portions of the photosensitive layer remain hard, that is do not soften or melt, at the softening temperature for the unexposed portions. The absorbent material collects the softened un-irradiated material and then is separated/removed from the photosensitive layer. The cycle of heating and contacting the photosensitive layer may need to be repeated several times in order to sufficiently remove the flowable composition from the un-irradiated areas and form a relief structure suitable for printing. After such processing, there remains a raised relief structure of irradiated, hardened composition that represents the irradiated image.

Photosensitive compositions may contain one or more components that can vaporize or volatilize when the element is heated to the temperature or temperatures necessary for thermal development to occur. The components that can vaporize or volatilize are generally low molecular weight organic compounds, such as monomer. The vapor can condense within a thermal development processor and drip uncontrolled onto different areas of the processor creating a mess within the processor. The formation of condensate in the processor typically depends on usage, with high volume and large plate size being contributing factors. Thus, the vapor and/or condensate from the vapor that remain inside the processor make it difficult to maintain the cleanliness and operation of the processor, and ultimately can damage the thermal development apparatus. In addition, the photosensitive elements can be damaged by the condensate. Condensate dripping onto an image area of the element causes disturbances in the surface of the element that can render the surface unsuitable for printing.

U.S. Publication No. 2005/0084791 A1 by Hackler et al. (published Apr. 21, 2005) discloses a method and apparatus for controlling the vapor and/or condensate created during thermal treatment of the photosensitive element. The vapor is collected at a heating station at or adjacent to where the photosensitive element is heated. The vapor and any resulting condensate are confined within a collection system until they can be effectively removed from the exhaust air. The vapor and/or condensate from the air are removed by converting the vapor to condensate, collecting the condensate, and then treating the condensate for disposal. The vapor and condensate are removed by a separation unit that condenses vapor into droplets, coalesces condensed droplets for collection, and then separates, i.e., by filtration, any remaining droplets (or condensate) from the air. A coalescing filter cartridge array is also mentioned as suitable for removing vapor and condensate from the air. Collected condensate is then drained from the processor or treated for easy disposal. The exhaust air may not, but usually does, need to be treated further to remove the remaining vapor from the air. An external filter or absorption unit may be connected to the exhaust to remove remaining vapor prior to discharging the air from the collection-treatment system or to the outside environment.

However, it is difficult to completely remove the organic material from the air. After collection and treatment to separate liquid condensate droplets from the air, some organic compounds can still remain in the vapor phase in the exhaust air. Oftentimes the remaining vapor then condenses further downstream in the process and still creates a mess for the customer and can damage the processor or exhaust ductwork. Additionally, even effective collection of the vapor and condensate and removal from exhaust air still creates a waste stream that requires handling for disposal.

Oxidation processes (catalytic or thermal) are used in large waste treatment operations in many industries including some printing operations to remove volatile organic constituents from the exhaust. In the printing industry, the organic components of the exhaust arise largely from solvents in the inks and other treatment steps used in the printing process, particularly associated with printing presses. The organic components from the printing process have to be removed from the exhaust air for regulatory compliance.

So a problem arises with effective removal of vapor and condensate collected during thermal development of photosensitive elements from air. It is desirable to remove the organic material from the air to such an extent that if any organic material remains after treatment that it does not impact air handling downstream from the processor to the exhaust. It is also desirable to remove volatilized organic components from the air to minimize handling of waste.

SUMMARY OF THE INVENTION

The present invention provides a method for forming a relief pattern from a photosensitive element containing a composition layer capable of being partially liquefied. The method comprises heating the composition layer to a temperature sufficient to cause a portion of the layer to liquefy and cause one or more organic compounds in the layer to form a vapor; and oxidizing the vapor.

The invention also provides an apparatus for forming a relief pattern from a photosensitive element containing a composition layer capable of being partially liquefied. The apparatus comprises means for heating the composition layer to a temperature sufficient to cause a portion of the layer to liquefy and cause one or more compounds in the layer to form a vapor; and means for oxidizing the vapor.

DESCRIPTION OF THE PREFERRED EMBODIMENTS

Figure 1:
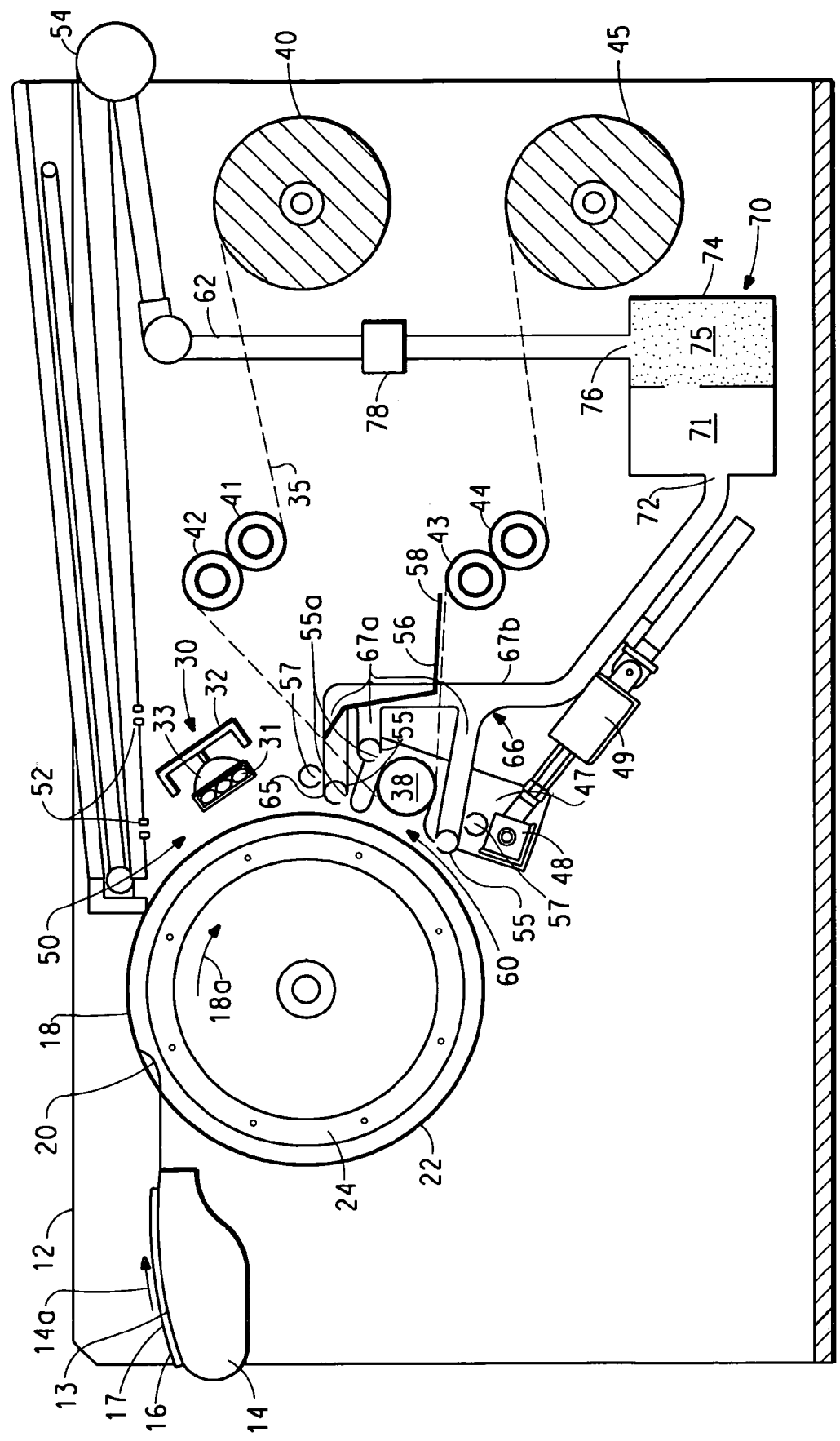
FIG. 1 is a schematic cross-sectional side view of one embodiment of a thermal development apparatus that includes a means for oxidizing vapor generated by heating a photosensitive element.

The present invention relates to a process and apparatus for treating a photosensitive element. In particular the invention relates to a process and apparatus for thermally treating a photosensitive element containing a composition layer capable of being partially liquefied. The composition layer is heated to a temperature sufficient to melt at least a portion of the layer and generate vapor. Particularly, the present invention is a process and apparatus for oxidizing vapor that is generated during thermal treating of the photosensitive element. In one embodiment, the photosensitive element forms a flexographic printing form after treating.

Thermal treating heats the photosensitive element to a development temperature that causes uncured portions of the composition layer to liquefy, i.e., melt or soften or flow, and be carried away by contact with an absorbent material. Cured portions of the photosensitive layer have a higher melting temperature than the uncured portions and therefore do not melt, soften, or flow at the thermal development temperatures. Thermal development of photosensitive elements to form flexographic printing plates is described in U.S. Pat. Nos. 5,015,556; 5,175,072; 5,215,859; and WO 98/13730. The photosensitive element includes a substrate and at least a composition layer mounted on the substrate. The composition layer is capable of being partially liquefied.

The term "melt" is used to describe the behavior of the unirradiated portions of the composition layer subjected to an elevated temperature that softens and reduces the viscosity to permit absorption by the absorbent material. The material of the meltable portion of the composition layer is usually a viscoelastic material which does not have a sharp transition between a solid and a liquid, so the process functions to absorb the heated composition layer at any temperature above some threshold for absorption in the absorbent material. A wide temperature range may be utilized to "melt" the composition layer for the purposes of this invention. Absorption may be slower at lower temperatures and faster at higher temperatures during successful operation of the process. Similarly, there may be less vaporization of components in the photosensitive layer at lower development temperatures and greater vaporization (which can be characterized by the amount of vapor formed and/or in the number of components that vaporize) at higher development temperatures.

Apparatuses suitable for thermally developing or treating the photosensitive element are disclosed by Peterson et al. in U.S. Pat. No. 5,279,697, and by Johnson et al. in U.S. Pat. No. 6,797,454. Although these patents depict that the photosensitive element is preferably placed on a drum for thermal treatment, it should be understood that the element could be placed on a planar surface, or on a combination of planar surface/s and roll/s, such as a belt supported system, for treatment. It should also be understood that one of ordinary skill in the art could modify the disclosed apparatus to accommodate mounting of the photosensitive element in the form of a cylinder or a sleeve on the drum, or two or more support rollers, or a suitable support structure. Another apparatus suitable for thermally developing a cylindrically-shaped photosensitive element is described in to U.S. patent application Ser. No. 11/269,096 filed Nov. 8, 2005.

Thermal treating, which may also be called thermal development, includes heating of an exterior surface 17 of the composition layer of the photosensitive element 16 to a temperature sufficient to cause a portion of the layer to liquefy. The at least one photosensitive layer (and additional layer/s if present) can be heated by conduction, convection, radiation or other heating methods to a temperature sufficient to effect melting of the uncured portions but not so high as to effect distortion of the cured portions of the layer. One or more additional layers disposed above the composition layer may soften or melt or flow and be absorbed as well by an absorbent material. The photosensitive element is heated to a surface temperature above about 40° C., preferably from about 40° C. to about 230° C. (104-446° F.) in order to effect melting or flowing of the uncured portions of the composition layer. The thermal treating steps of heating the photosensitive element 16 and contacting an outermost surface of the element with an absorbent material can be done at the same time, or in sequence provided that the uncured portions of the photopolymerizable layer are still soft or in a melt state when contacted with the absorbent material.

FIG. 1 shows an embodiment of a thermal processor 10. A drum 18 is mounted for rotation on a stationary support frame 12 and rotates in a clockwise direction as indicated by arrow 18a. A photosensitive element 16 is placed on a surface 13 of feed tray 14 and is urged in a direction indicated by arrow 14a. The drum 18 includes a clamp 20 that captures a leading edge of the photosensitive element 16 to mount the element 16 onto the drum. The element 16 remains substantially in contact with an outer surface 22 of the drum 18 during processing.

The drum 18 may be equipped with a heater 24, which is provided to keep the photosensitive element 16 at a stable starting temperature independent of the surrounding environment. Any means of heating the drum 18 is acceptable, as long as the power capacity of the heater is sufficient to maintain a fairly constant selected skin temperature on the outer surface 22 of the drum 18 of about 50-150° F. (10-65.6° C.), preferably 65 to 95° F. (18.3-35° C.). The means for heating the drum is capable of heating the drum 18 to a temperature capable of heating the exterior surface 17 of the composition layer. The heater 24 may be an electrical heating blanket, such as a wire wound blanket. If the normal operating environment is carefully controlled to be at a constant temperature, the heater can be turned off or omitted from the apparatus. As is disclosed in U.S. Pat. No. 6,797,454, it is also possible that the drum be cooled by cooling means, such as, a blower directing a stream of air at the surface of the photosensitive element and the drum and/or by the circulating of cooling fluid beneath the surface of the drum to cool the support side of the element.

Located adjacent the drum 18 is a first heating means comprising a heater 30 which, in the embodiment illustrated, is a radiant heater directed at an exterior surface 17 of the photosensitive element 16 on the drum 18.

The heater 30 can provide focused or diffused radiant heat. The heater 30 elevates the temperature of the exterior surface 17 of the composition layer. In one embodiment, the heater 30 elevates the temperature of the surface 17 of the composition layer to a temperature sufficient to melt the unirradiated portion of the composition layer, causing a portion of the layer to liquefy. The heater 30 is a type of heater that does not appreciably heat the substrate supporting the composition layer. The heater 30 applies heat to the exterior surface 17 of the composition layer. In the embodiment illustrated, the heater 30 comprises a plurality of tubular infrared heating bulbs, such as bulbs 31 mounted in end supports, such as support 32 that also provide electrical connections to the bulbs 31. Adjacent the side of the bulbs 31 opposite drum 18 is a reflector 33 that acts to direct the infrared radiation toward the exterior surface 17 of the photosensitive element sheet 16. An alternate embodiment of the heater 30 uses one tubular infrared heating bulb 31 mounted in the end supports 32 with the reflector 33.

In the embodiment shown, the processor 10 includes a delivery means for feeding a continuous web 35 of a development medium, which contacts a hot roller 38. A second means for heating includes the hot roller 38. The hot roller 38 is positioned adjacent the drum 18 which carries the photosensitive element 16. The hot roller 38 is also adjacent the heater 30, and the hot roller 38 maintains or further elevates the temperature of the exterior surface 17 of the composition layer. The hot roller 38 applies heat to the exterior surface 17 of the photosensitive element 16. The web 35 of the development medium is unwound from a supply roll 40 and passes between rolls 41 and 42 in a serpentine path. The web 35 is then guided over the hot roller 38 and over rolls 43 and 44. One or more of the rolls 41, 42, 43, 44, or 45 drive the web 35. One or more of the rolls 40, 41, 42, 43, 44 may include a braking mechanism to maintain tension of the web in its transport path. The web 35 is then wound up on take up roll 45.

The processor 10 is provided with a means for relative motion between the drum 18 and the hot roller 38, so that the photosensitive element 16 and the web 35 of absorbent material can be brought into contact with the other. Means for providing relative movement can be accomplished, for example, by mounting the hot roller 38 (and/or drum 18) onto arms 47 attached to a beam 48 that moves the hot roller 38 under the urging of one or more actuators 49. Temperature sensors may be mounted throughout the processor to monitor the temperature for the purpose of controlling the heating elements in the drum 18, hot roller 38, and radiant heater 30.

The radiant heater 30 acting as a first heating means, the hot roller 38 acting as a second heating means, and the drum heater 24 acting as a third heating means, independently or in any combination, are capable of heating the exterior surface 17 of the photosensitive element 16 to a temperature sufficient to cause a portion, i.e., an unirradiated portion, of the composition layer to liquefy. The first heating means, the second heating means, and the third heating means independently or in any combination constitute a heating station 50. A preferred heating station 50 includes the first heating means and the second heating means.

Heating the composition layer to a temperature sufficient to cause a portion of the layer to liquefy can also cause one or more components in the layer to form a vapor. The vapor formed by heating of the photosensitive element is composed primarily of organic compounds, such as monomer or monomers, in the composition layer. The vapor can also be formed from volatilization of other low molecular weight organic compounds that are present in the composition layer. In addition, it is possible that one or more components from additional layers on the composition layer may volatilize upon heating that are included in the vapor. The temperature of the vapor is at least the temperature at which thermal development occurs, that is between 40-230° C.

Oxidizing of the vapor can be by a thermal or a catalytic process. Both oxidation processes convert the organic compounds in the vapor into innocuous components such as carbon dioxide and water vapor. Oxidation processes avoid forming a liquid waste stream that would require handling for disposal. Thermal oxidizing processes typically involve directing the vapor to burn with an open flame supplied by a fuel. Catalytic oxidation processes typically involve heating the vapor and passing the heated vapor across a catalyst to oxidize the organic compounds. The catalyst material is capable of oxidizing a number of organic substances to carbon dioxide and water at catalyst surface temperatures of at least 150° C. Heating to an elevated temperature also vaporizes any liquid droplets that are contained in the exhaust. It is expected that at least 90%, preferably at least 95%, of the organic compounds are converted to innocuous components. Trace amounts of organic compounds may be present in the air (vapor) resulting from the catalytic oxidation process. Oxidation can remove the organic compounds in the vapor to such an extent that handling of the air downstream of the processor (i.e., oxidation treatment) is not impacted by any remaining trace amounts of organic compounds. Catalytic oxidation is a preferred oxidation process for safety, economics, ease of use, and reduced concern for generating unwanted byproducts (such as for example, nitrogen oxides).

One embodiment for oxidizing the vapor is with catalytic oxidation. The vapor can be heated to any temperature suitable for the catalytic oxidation reaction to occur. The temperature of the vapor can be at the temperature at which thermal development occurs, that is between 40-230° C., prior to entering an oxidation unit. In one embodiment, the temperature of the vapor entering the oxidation unit can be such that the vapor does not need to be additionally heated for catalytic oxidation to occur. Depending at least on the residence time in the processor and/or in a collection member prior to entering the oxidation unit, and the distance of the unit from the processor, the temperature of the vapor may be the same or substantially the same as the development temperature, or more likely has cooled below the development temperature. In one embodiment, the vapor is heated for catalytic oxidation to at least the temperature at which the organic compound or compounds volatize. In another embodiment, the vapor is heated for catalytic oxidation to a temperature above the temperature at which the organic compounds volatize. In another embodiment, the vapor is heated for catalytic oxidation to a temperature substantially above the temperature at which the organic compound or compounds volatize.

The vapor is heated to a temperature at which the catalyst material is capable of oxidizing the organic compounds contained in the vapor. In one embodiment, the vapor may be heated to at least 150° C. for catalytic oxidation. In one embodiment, the vapor may be heated to greater than 200° C. for catalytic oxidation. In another embodiment, the vapor may be heated to at least 300° C. for catalytic oxidation. In one embodiment, the vapor is heated to about 315 to 340° C. In one embodiment, the vapor may be heated to 650° C. for catalytic oxidation. Although catalytic oxidation can occur at low temperatures, for example at temperatures less than 300° C., these low temperature oxidation systems generally are cost prohibitive and may not provide the desired efficiency to remove the organic compounds. Oftentimes the catalyst material is effective within a temperature range, and elevating the temperature of the vapor to the high end of the temperature range may be necessary for effective removal of various organic compound or compounds. However in order to conserve energy and operational costs, it is preferable to operate near (but above) the minimum temperature necessary for effective catalytic oxidation of the one or more organic compounds.

In one embodiment, oxidization of the vapor occurs in a container 70 provided with a means for heating the vapor and catalytic oxidation material. As shown in FIG. 1, the container may be located inside the thermal development apparatus 10. Alternatively the container may be located external to the apparatus. The container 70 includes at least one chamber 71 having at least one entry port 72 for the vapor and containing the means for heating the vapor (not shown), followed by another chamber 74 containing the catalyst material 75 and having an exit port 76 for air that has been purified (which hereinafter may be referred to as purified air). It should be understood that the purified air contains carbon dioxide and water vapor, and may contain trace amounts of one or more organic compounds. The means for heating the vapor in the catalytic oxidizer container is not limited and can include electric heating coil, injection of heated gases, a flame, or other exothermic chemical reactions, or by transfer with a heat exchange fluid, or combinations thereof. The vapor is pulled into the container 70 by a means for transporting the vapor, such as a blower or fan. The means for transporting may be included at the exit port 76 of the container 70. Alternatively the means for transporting, such as a vacuum fan 78 shown in FIG. 1, may be outside the container 70 interspersed in a conduit 62 from the exit port 76 to an exhaust port 54 for the purified air. The means for transporting the vapor may also be considered a means for collecting the vapor from the processor. The oxidation container 70, the means for heating the vapor, and the means for transporting the vapor across the catalyst material and through at least the container constitute an oxidation system assembly.

Suitable catalyst material 75 may be a noble metal oxidation catalyst selected from the group consisting of gold, silver, platinum, palladium, iridium, rhodium, mercury, ruthenium and/or osmium. Catalysts that contain gold, silver, platinum and/or palladium are preferred. The catalyst material may be supported on a metal substrate, or ceramic substrate, or an inert, porous support, such as potassium aluminum silicate. Typically catalyst material is in fine granular form and supported on a substrate to maximize the surface area available for reaction with components in the gas phase. Johnson Matthey (Wayne, Pa.) and Engelhard (Iselin, N.J.) are suppliers of suitable oxidation catalyst materials.

Depending upon the type of catalyst used in a catalytic oxidation system, there are materials that can deactivate the catalyst either temporarily or permanently. Care should be taken to avoid the use of these materials in the photosensitive element composition and/or the creation of these materials by thermal treatment of the photosensitive element. Fortunately, the components typically used in photosensitive elements for flexographic printing are not usually the materials of concern. For example, the use of a noble metal catalyst is discouraged if the vapor may contain components such as sulfur, chlorine, or silicon. The catalyst supplier should provide guidance for a catalyst suitable for a particular composition of the photosensitive element.

The purified air leaving the catalyst surface can exit the container 70 and be exhausted from processor 10 or from the operation area. Oxidization of the vapor results in purified air containing at least carbon dioxide and water vapor in amounts greater than that found in the ambient air. The purified air can be dispersed to a room or workspace where the processor 10 is located, usually with suitable thermal treatment to avoid overheating the workspace. The purified air can also be returned to the processor 10. Optionally, in one embodiment the purified air can be cooled with a simple heat exchanger (not shown) with outside ambient air circulation. Optionally in another embodiment, a heat exchanger can be used to cool the purified air and to heat the vapor prior to the entry of the vapor in the oxidation container 70. In this embodiment, the heat exchanger thus can act as a means for preheating the vapor prior to oxidation. This embodiment also has the advantage of reducing the accumulation of heat in the apparatus and/or the operating environment.

In one embodiment, all or a substantial portion of the vapor formed is treated to oxidize all the organic compounds and purify the resulting air stream. Air from within the apparatus 10 may also be captured with the vapor that enters the oxidation container 70. Inclusion of the air with the vapor does not interfere with oxidation of the organic compounds in the vapor. However, the additional volume of air could need to be heated prior to oxidation of the vapor, which would increase the operational cost of the oxidation system. It may be desirable to minimize the volume of non-contaminated air that is captured and handled by the oxidation system assembly, so as to mitigate the additional cost.

The apparatus may include a means for collecting the vapor at or adjacent where the vapor is generated, before the vapor is diluted by the air that does not having any organic contaminants. Additionally or alternatively, the apparatus may include a means to isolate the vapor from the air in the surrounding environment of the apparatus to reduce the volume of air necessary to collect all or substantially all the vapor. The means for transporting (e.g., vacuum fan) the vapor also would need to be sized accordingly to transport the additional volume of air through the container. In one embodiment (not shown), the entry port of the oxidation container may be connected to an exhaust port of the apparatus. In another embodiment (not shown) where the oxidation container is located within the apparatus, the entry port of the container may be located in proximity to the heating station. The location of the oxidation system and its proximity to heating station do not necessarily influence the effectiveness of the oxidation system at removing the organic materials from the vapor, but can aid in the collection and/or isolation of the vapor and reduce the capture of additional non-vapor laden air (i.e., clean air). For example, in an embodiment that does not include the means for collecting vapor or the means for isolating the vapor, the closer the entry port of the container is to the heating station where the vapor is created, the more effectively the vapor will be directed to or captured by the oxidation system at a given exhaust flow rate or effective collection can be achieved with a lower total exhaust flow. In another embodiment, a means for isolating the vapor from the clean air in the processor is to entrain the vapor in a moving air stream directed toward a collection system or the oxidation system. Thus, if the collection system is not physically close to the heating station where the vapors are generated, the entrained air flow can function to extend the collection system to induce collection and hence capture the vapor entrained in the moving air.

In one optional embodiment the vapor formed at the heating station 50 during thermal development is collected at or near the location where the vapor is generated, that is, at the heating station, in order minimize the impact of vapor on other surfaces within the apparatus. By collecting the vapor at the heating station 50, the constituents of the vapor or any condensate do not disturb the relief surfaces of the photosensitive element currently being developed as well as the photosensitive elements that subsequently enter the process. Collecting and containing the vapor formed during thermal development will also improve the cleanliness and operation of the thermal processor. In addition, the collection of the vapor at the heating station reduces the volume of non-contaminated air captured by the oxidation system.

The vapor can be collected at or adjacent to where the photosensitive element 16 is being heated at the heating station 50. The means for collecting the vapor collects the vapor as the vapor emits from the composition layer of the photosensitive element 16. The means for collecting the vapor can include at least one collection member 55, such as a manifold. The collection member 55 is positioned at the heating station 50 to collect as much of the vapor as it forms, and as such can be positioned anyplace in a region in and surrounding the heating station 50. Since vapor is most likely to form when the composition layer is reaching or reaches the temperature to liquefy, the at least one collection member 55 is placed at or adjacent to a nip 60 where the exterior surface 17 of the photosensitive element 16 contacts the development medium 35. The at least one collection member 55 is adjacent to the hot roller 38 and the drum 18. The at least one collection member 55 is supported in the processor 10 by mounting brackets secured to the frame 12 or a side wall or an interior wall of the processor 10. The at least one collection member 55 can be stationary or can move with the hot roller 38 when the roller 38 is urged toward the drum 18.

There may be one or more collection members 55 at the heating station 50 that are spaced about the hot roller 38 and even the heater 30. At least one collection member 55 may be located on each side of the nip 60. The at least one collection member 55 is the same or substantially the same axial length as the hot roller 38. The at least one collection member 55 is a tube having a plurality of openings 55a or one or more axial slots for taking in the air containing the vapor. The vapor can be drawn into the at least one collecting member 55 by the vacuum fan 78 that is ultimately connected to the means for oxidizing the vapor, or by another vacuum fan associated with the means for collecting. The vacuum fan 78 can be turned on when the processor begins operation, and would remain on through the development, i.e., for the total number of cycles of heating and contacting, of the photosensitive element 16. The fan may also run, preferably at low speed, during idle periods to capture any vapor from heating or maintaining the standby temperature inside the processor.

The means for isolating the vapor can include one or more shrouds, baffles, brushes or other structures or devices that can be appropriately positioned about the heating station to isolate and/or contain the vapor and reduce the amount of additional air (i.e., non-vapor laden air) collected with the vapor for oxidation. The means for isolating creates an enclosure of sorts about the heating station that minimizes the transfer of vapor to and air from the surrounding environment, while providing gaps necessary for the photosensitive element and the development medium move through the heating station.

Optionally, the apparatus 10 can include at least one shroud 56 that isolates or substantially isolates the air with the vapor at the heating station 50 region from the remainder of the interior environment of the processor 10. The shroud 56 is located on a backside of the hot roller 38 opposite the drum 18 to substantially enclose the at least one collection member 55 at the heating station 50. The shroud 56 helps to keep the air with the vapor in the heating station 50 region, so that the at least one collection members 55 can collect the vapor before the vapor escapes to other environs of the processor 10. In the embodiment shown, an end 58 of the shroud 56 is extended along the path of the web 35 after the web has contacted the hot roller 38. Thus the shroud 56 covers the web 35 while the web is still hot and helps to isolate vapor as vapor can continue to emit from the uncured portions of the composition layer that are carried away in the web. In an alternate embodiment, multiple shrouds 56 could be placed around the at least one collection members 55. In another alternate embodiment, a box-like shroud could be located around the collecting member or members 55, with openings to allow the absorbent web 35 to enter and leave, and at the nip between the hot roller 38 and the drum 18.

The means for isolating the vapor can also include a supply of air, which may also be called an air knife or an air curtain, that can serve to isolate the vapor from the processor environment. Optionally, the supply of air may be included at the heating station 50, near or adjacent to the at least one collection members 55. The supply of air can serve to contain and direct the vapor toward the at least one collection members 55. As shown in FIG. 1, the air curtain can be supplied using one or more tubular members 57 each of which parallels or substantially parallels the adjacent collection member 55. The tubular members 57 each have a plurality of openings that supply the air to the heating station 50. Preferably, the air curtain supplies air via the tubular member 57 at each of the collection members 55 located prior to and after the nip 60. The air supplied by the air curtain is typically less than 10% of the total air removed by the at least one collection member 55, preferably less than 5%. Air can be supplied from any convenient source of pressurized air, such as, for example, a compressed air line, a dedicated blower, or a side stream from a larger blower. It is also contemplated that the supply of air can be provided by directing all or a small stream of the air purified by the oxidation process. In the embodiment where the vapor is entrained in a moving air stream to collect the vapor, the additional air flow can also create a flow field that confines the vapor to act as a means for isolating the vapor, and can lend to more effective capture of vapor.

In one embodiment, the alternate means for collecting the vapor captures all or a majority of the vapor as it is generated. It is possible that only some of the vapor may be collected in this embodiment and the remainder of the vapor removed with the exhaust 54. Depending on the fraction of the vapor exiting with the exhaust, it may desirable to locate the oxidation system assembly downstream of all vapor collection points so that the maximum amount of vapor is treated. The optional means for isolating the vapor including the at least one shroud and the air curtain, the means for transporting the vapor, and the alternate means for collecting the vapor, can be used alone or in combinations of one or more to confine and/or capture the vapor and direct the vapor to the oxidation system. The means for isolating the vapor, the means for transporting the vapor, and the alternate means for collecting the vapor, can alone or in combination constitute a means for collecting the vapor.

In the embodiment shown in FIG. 1, a first end 65 of all of the collection members 55 each connect to one or more conduits 66 and that direct the vapor from the collection member/s 55 to the means for oxidizing the vapor. The collected vapor is contained and directed through the conduits 66 to the means for oxidizing of the vapor. The first end 65 of the collection member 55 is connected to a first conduit 67a which in turn is connected to a second conduit 67b. In one embodiment, the conduit 67b connects to the entry port 72 of the container 70. In an alternate embodiment, a second end of the collection member 55 (coming out of the plane of the processor cross-section) can similarly connect to a series of interconnected conduits 66 that direct the vapor from the collection member to the oxidation container 70.

After collection, while in the collection member/s 55 or in the conduits 66, the vapor may cool or be cooled such that one or more of the components in the vapor condenses to a liquid or liquid-like form. If the vapor cools while in the collection member/s 55 and forms condensate, moving air carries the condensate to the means for oxidizing the vapor. In the embodiment shown, the first conduits 67a are connect to the second conduit 67b which is oriented vertically or substantially vertically so that, if the vapor condenses, the condensate flows under gravity toward the means for managing the removal of vapor. Cooling may occur naturally as the air with vapor is transported away from the heating station 50 through the collection member 55 and the conduits 66. Usually condensed material will revaporize upon heating prior to the oxidation system assembly or in the first chamber of the container 70. One of ordinary skill in the art would take suitable precautions to design the method for heating the feed stream for the oxidation assembly if liquid is likely to be present in the stream.

Alternatively, the vapor may be heated with for example, an electrical wire wrapped about one or more of the first and second conduits 67a, 67b. Heating the conduits maintains the vapor in its vaporized state prior to oxidation, and can reduce the energy necessary to heat the vapor in the oxidation container. It is also contemplated that the vapor, heated or unheated, may be transported through the conduits 66 directly to the exhaust 54, for treatment to oxidize the organic compounds in the container of the oxidation system assembly that is located external to the processor 10. In this embodiment it may be necessary to heat or insulate ductwork or an external conduit between the exhaust of the apparatus and the oxidation container in order to maintain the organic components in their vapor state for entry into the container. Alternatively, the vapor can be allowed to cool to the extent that the organic components condense prior to entry in the oxidation system assembly located external to the apparatus. However, in this case care should be taken that the ductwork or external conduit between the exhaust of the apparatus and the container is designed to transport (and drain) the accumulated liquid condensate to the oxidation system assembly.

The processor 10 may also include a heat management system for controlling the heat generated by thermal development. Outlets 52 are positioned above the heat station 50 to direct heated air out of the interior of the processor but are sufficiently far removed to minimize the chance of capturing vapor into the heat management system. The heated air exits the processor 10 through the exhaust 54.

In another embodiment, the vapor may be pretreated to remove some or part of the organic compounds from the vapor, and then the pretreated vapor would undergo oxidation in order to remove or substantially remove the one or more organic compounds from the air prior to disbursement into ambient air. The vapor may be pretreated with a means for controlling the vapor, which can include one or a combination of a means for collecting the vapor, a means for containing the vapor, and a means for managing the removal of the vapor as disclosed by Hackler et al. in US Publication 2005/0084791 A1, published Apr. 21, 2005. Advantageously, the method and apparatus of the present invention provides a means for oxidizing the vapor containing one or more organic compounds that are generated in thermal development of a photosensitive element. The vapor and condensate generated by thermal development is heated and undergoes an oxidation process, preferably a catalytic oxidation process. The oxidation process converts the one or more organic compounds into carbon dioxide and water vapor that can then be safely exhausted by conventional means from the processor and the customer's shop, or even returned to the interior environment of the apparatus.

Photosensitive Element

The present invention is not limited to the type of element that is thermally processed, provided that the element generates a vapor upon heating. In one embodiment, the element is a photosensitive element that includes a flexible substrate and a composition layer mounted on the substrate. The composition layer is at least one layer on the substrate capable of being partially liquefied. Preferably, the photosensitive element is an elastomeric printing element suitable for use as a flexographic printing form. The at least one layer on the substrate is preferably a photosensitive layer, and most preferably a photopolymerizable layer of an elastomeric composition wherein the photosensitive layer can be selectively cured by actinic radiation. As used herein, the term "photopolymerizable" encompasses systems which are photopolymerizable, photocrosslinkable, or both. In cases where the composition layer comprises more than one photosensitive layer on the flexible substrate, the composition of each of the photosensitive layers can be the same or different from any of the other photosensitive layers.

The layer of the photosensitive composition is capable of partially liquefying upon thermal development. That is, during thermal development the uncured composition must soften or melt at a reasonable processing or developing temperature. Heating the exterior surface of the composition layer to a temperature sufficient to cause a portion of the layer to liquefy also can cause one or more components in the layer to form a vapor.

The photosensitive layer includes at least one monomer and a photoinitiator, and optionally a binder. The at least one monomer is an addition-polymerizable ethylenically unsaturated compound with at least one terminal ethylenic group. Monomers that can be used in the photosensitive layer are well known in the art and include monofunctional acrylates and methacrylates, multifunctional acrylates and methacrylates, and polyacryloyl oligomers.

The photoinitiator is a compound that generates free radicals upon exposure to actinic radiation. Any of the known classes of photoinitiators, particularly free radical photoinitiators such as quinones, benzophenones, benzoin ethers, aryl ketones, peroxides, biimidazoles, diaryliodoniums, triarylsulfoniums, and phosphoniums, and diazoniums, may be used. Alternatively, the photoinitiator may be a mixture of compounds, one of which provides the free radicals when caused to do so by a sensitizer activated by radiation.

The optional binder is a preformed polymer that serves as a matrix for the monomer and photoinitiator prior to exposure and is a contributor to the physical properties of the photopolymer both before and after exposure. In one embodiment the optional binder is elastomeric. A non-limiting example of an elastomeric binder is an A-B-A type block copolymer, where A represents a nonelastomeric block, preferably a vinyl polymer and most preferably polystyrene, and B represents an elastomeric block, preferably polybutadiene or polyisoprene. Other suitable photosensitive elastomers that may be used include polyurethane elastomers, such as those described in U.S. Pat. Nos. 5,015,556 and 5,175,072. The monomer or mixture of monomers must be compatible with the binder to the extent that a clear, non-cloudy photosensitive layer is produced.

Additional additives to the photosensitive layer include colorants, processing aids, antioxidants, and antiozonants. Processing aids may be such things as low molecular weight polymers compatible with the elastomeric block copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

The photosensitive element may include one or more additional layers on the side of the photosensitive layer opposite the substrate, as is well known to those skilled in the art. Examples of additional layers include, but are not limited to, a release layer, a capping layer, an elastomeric layer, a laser radiation-sensitive layer (typically an infrared laser radiation sensitive layer), a barrier layer, and combinations thereof. The one or more additional layers preferably are removable, in whole or in part, by contact with an absorbent material in the range of acceptable developing temperatures for the photosensitive element used. The one or more additional layers may contain components that can vaporize under the conditions of thermal development. One or more of the additional other layers can cover or only partially cover the photosensitive composition layer. The materials suitable for use as the additional layers are conventional and are well known to those of ordinary skill in the art.

The photosensitive element of the present invention may further include a temporary coversheet on top of the uppermost layer of the photosensitive element to protect the uppermost layer of the photosensitive element during storage and handling. Depending upon end use, the coversheet may or may not be removed prior to imaging, but is removed prior to development.

The substrate is selected to be tear resistant and must have a fairly high melt point, for example, above the melt temperature of the composition layer formed on the substrate. The material for the substrate is not limited and can be selected from polymeric films, foams, fabrics, and metals. The substrate can be almost any polymeric material that forms films that are non-reactive and remain stable throughout the processing conditions.

The substrate of the photosensitive element has a thickness of between about 0.01 mm and about 0.38 mm. The photopolymerizable composition layer is between about 0.35 mm and about 7.6 mm thick, with a preferred thickness of about 0.5 mm to 3.9 mm (20 to 155 mils).

The photosensitive element is prepared for thermal development by imagewise exposing the element to actinic radiation. After imagewise exposure, the photosensitive element contains cured portions in the exposed areas of the radiation curable composition layer and uncured portions in the unexposed areas of the radiation curable composition layer. Imagewise exposure is carried out by exposing the photosensitive element through an image-bearing mask. The image-bearing mask may be a black and white transparency or negative containing the subject matter to be printed, or an in-situ mask formed with the laser radiation sensitive layer on the composition layer, or other means known in the art. On exposure, the transparent areas of the mask allow addition polymerization or crosslinking to take place, while the actinic radiation opaque areas remain uncrosslinked. Exposure is of sufficient duration to polymerize or crosslink the exposed areas down to the support or to a back exposed layer (floor). Imagewise exposure time is typically much longer than backflash time, and ranges from a few to tens of minutes.

For direct-to-plate image formation as disclosed in U.S. Pat. Nos. 5,262,275; 5,719,009; 5,607,814; 5,506,086; 5,766,819; 5,840,463 and EP 0 741 330 A1 the image-bearing mask is formed in-situ with the laser radiation sensitive layer using an infrared laser exposure engine. The imagewise laser exposure can be carried out using various types of infrared lasers, which emit in the range 750 to 20,000 nm, preferably in the range 780 to 2,000 nm.

Actinic radiation sources encompass the ultraviolet, visible and infrared wavelength regions. The suitability of a particular actinic radiation source is governed by the photosensitivity of the initiator and the at least one monomer used in preparing the flexographic printing plates from the photosensitive element. The preferred photosensitivity of most common flexographic printing plates are in the UV and deep visible area of the spectrum, as they afford better room-light stability. The portions of the composition layer that are exposed to radiation chemically cross-link and cure. The portions of the composition layer that are unirradiated (unexposed) are not cured and have a lower melting temperature than the cured irradiated portions. The imagewise exposed photosensitive element is then ready for heat development with the absorbent material to form a relief pattern.

An overall back exposure, a so-called backflash exposure, may be conducted before or after the imagewise exposure to polymerize a predetermined thickness of the photopolymer layer adjacent the support. This polymerized portion of the photopolymer layer is designated a floor. The floor thickness varies with the time of exposure, exposure source, etc. This exposure may be done diffuse or directed. All radiation sources suitable for imagewise exposure may be used. The exposure is generally for 10 seconds to 30 minutes.

Following overall exposure to UV radiation through the mask, the photosensitive printing element is thermally developed to remove unpolymerized areas in the photopolymerizable layer and thereby form a relief image. The thermal development step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer.

The operation of one embodiment of the apparatus 10 for the process of thermally developing the photosensitive element is described in reference to FIG. 1. The plate processor 10 is in a home position with the drum 18 stationary with the clamp 20 positioned near the top of the drum adjacent the feed tray 14. The operator places the photosensitive element 16 on feed tray 14. An operator then opens clamp 20 and engages the leading edge 24 of the element 16 in clamp 20. The drum heater 24 or the IR heater 30 may be used to preheat the drum 18. The cartridge heater (not shown) for the hot roll 38 is used to preheat the hot roll. The drum 18 starts turning and carries the element 16 with it. The heater 30 may preheat the bulbs 31 before the element 16 reaches the heater 30, and then switch to an operating setting to achieve the desired temperature for melting the composition layer on element 16. As the leading edge 24 of the element 16 reaches the position where the hot roll 38 will contact the drum 18, the hot roll actuators 49 move the hot roll 38 carrying the web 35 of the development medium against the element 16. The photosensitive element composition layer is heated to between 40 and 230° C. (104-392° F.) while in contact with the development medium. The development medium contacts the exterior surface 17 of the composition layer of the heated photosensitive element, and removes the liquefied portions of the elastomeric polymer from the unirradiated portions of the composition layer, forming a flexographic printing form in which portions are removed as shown to form a relief pattern or surface. By maintaining more or less intimate contact of the development medium with the composition layer that is molten in the uncured regions, a transfer of the uncured photosensitive material from the photopolymerizable layer to the development medium takes place. While still in the heated condition, the development medium is separated from the cured photosensitive element 16a to reveal the relief structure. At the same time as heating the photosensitive element, vapor is generated that contains one or more organic compounds from the composition layer (and/or other additional layers) or reaction or decomposition products thereof. Vapor is collected in the at least one collection member 55 and transported by vacuum fan 78 through conduits 66 to the entry port 72 of the oxidation container 70. The vapor is heated in the first chamber 71 of the oxidation container 70 to a temperature suitable for the oxidation catalyst to convert the one or more organic compounds in the vapor to carbon dioxide and water vapor. The heated vapor passes through a second chamber 74 containing the catalyst material 75 and exits the oxidation chamber 70 through port 76 as purified air. Optionally the purified air can be sent through a heat exchanger, prior to exiting the processor through the exhaust.

As the trailing edge of the element 16 passes the hot roll/drum contact point, i.e., nip, the heater 30 may cool down or turn off, the actuator 49 will retract the hot roll 38, and the web 35 can be stopped. The drum 18 may return the leading edge of the element 16 to the home position to begin another cycle of heating and contacting. A cycle of the steps of heating the photopolymerizable layer and contacting the molten (portions) layer with the development medium can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the development medium to the photopolymerizable layer (while in the uncured portions are melt) may be maintained by the pressing the layer and the development medium together.

The development medium is selected having a melt temperature exceeding the melt temperature of the unirradiated or uncured portions of the radiation curable composition and having good tear resistance at the same operating temperatures. Preferably, the selected medium withstands temperatures required to process the photosensitive element during heating. The development medium may also be referred to as an absorbent material. The development medium is selected from non-woven materials, paper stocks, fibrous woven material, open-celled foam materials, porous materials that contain more or less a substantial fraction of their included volume as void volume. The development medium can be in web or sheet form. The development medium should also possess a high absorbency for the molten elastomeric composition by milligrams of elastomeric composition that can be absorbed per square centimeter of the development medium. It is also desirable that fibers are bonded in an absorbent material so that the fibers are not deposited into the plate during development. Non-woven webs of nylon or polyester are preferred.

After thermal development, the flexographic printing form may be post exposed and/or chemically or physically after-treated in any sequence to detackify the surface of the flexographic printing form.

What is claimed is:

1. A method for forming a relief pattern from a photosensitive element containing a composition layer capable of being partially liquefied, comprising:
heating the composition layer to a temperature sufficient to cause a portion of the layer to liquefy and cause one or more organic compounds in the layer to form a vapor;
oxidizing the vapor to form purified air at an oxidizing temperature; and
thermally contacting the vapor and purified air to preheat the vapor prior to oxidizing and to cool the purified air below the oxidizing temperature.

2. The method of claim 1 wherein oxidizing comprises converting the one or more organic compounds to carbon dioxide and water vapor.

3. The method of claim 1 wherein the oxidizing is by catalytic oxidation.

4. The method of claim 1 wherein the oxidizing is by thermal oxidation.

5. The method of claim 1 further comprising collecting the vapor.

6. The method of claim 5 wherein the collecting the vapor is at a heating station at or adjacent to the heating of the composition layer.

7. The method of claim 1 further comprising contacting the photosensitive element with a development medium to remove at least a portion of the liquefied material by the development medium.

8. The method of claim 7 wherein the contacting is pressing the photosensitive element and the development medium into contact at a pressure sufficient for at least a portion of the liquefied material to be removed by the development medium.

9. The method of claim 7 further comprising separating the photosensitive element from the development medium.

10. The method of claim 7 further comprising collecting the vapor at a heating station at or adjacent to the contacting with the development medium.

11. The meted of claim 1 further comprising:
supplying a development medium to an exterior surface of the composition layer, and
supporting the photosensitive element.

12. The method of claim 1 wherein the composition layer has an exterior surface, and the heating is selected from the group consisting of:
a first heating to apply heat to the exterior surface of the composition layer adjacent where a development medium contacts the layer;
a second heating to heat a first member supplying the development medium to a temperature capable of heating the exterior surface of the composition layer while the development medium is contacting the exterior surface of the layer;
a third heating to heat a second member supporting the photosensitive element to a temperature capable of heating the exterior surface of the composition layer;
a combination of the first heating and the second heating;
a combination of the first heating and the third heating;
a combination of the, second heating and the third heating; and
a combination of the first heating, the second heating and the third heating.

13. The method of claim 1 further comprising heating the vapor to a temperature of at least 150° C. prior to oxidizing.

14. The method of claim 1 further comprising heating the vapor to a temperature between 200 and 650° C. prior to oxidizing.

15. The method of claim 1 further comprising heating the vapor to a temperature of at least 300° C. prior to oxidizing.

16. The method of claim 1 further comprising heating the vapor to a temperature of about 315 to 340° C. prior to oxidizing.

17. The method of claim 1 wherein the thermally contacting step is performed by transporting the vapor and purified air through a heat exchanger.

18. The method of claim 1 further comprising supplying all or a portion of the purified air to a heating station.

19. The method of claim 1 further comprising maintaining the vapor at a temperature sufficient to keep the vapor in its vaporized state for oxidation.

20. The method of claim 1 further comprising isolating the vapor at a heating station.

21. The method of claim 20 wherein the isolating step is performed by positioning at least one structure selected from the group consisting of shroud, baffle and brush about the heating station.

22. The method of claim 20 wherein the isolating step is performed by supplying a curtain of air at the heating station.

23. The method of claim 1 further comprising means for transporting the vapor to the oxidizing step.

24. The method of claim 1 wherein the oxidizing is by catalytic oxidation using a catalyst material selected from the group consisting of gold, silver, platinum, palladium, iridium, rhodium, mercury, ruthenium, osmium, and combinations thereof.

25. The method of claim 1 further comprising:
imagewise exposing the photosensitive element to actinic radiation prior to heating; and
contacting the photosensitive element with a development medium to allow at least a portion of the liquefied material of the composition layer to be removed by the development medium to form the relief pattern.

26. A flexographic printing form prepared according to the method of claim 25.

27. An apparatus for forming a relief pattern from a photosensitive element containing a composition layer capable of being partially liquefied, comprising:
means for heating the composition layer to a temperature sufficient to cause a portion of the layer to liquefy and cause one or more compounds in the layer to form a vapor;
means for oxidizing the vapor to form purified air at an oxidizing temperature; and
a heat exchanger for thermally contacting the vapor and purified air to preheat the vapor prior to oxidizing and to cool the purified air below the oxidizing temperature.

28. The apparatus of claim 27 wherein the means for oxidizing comprises means for passing the vapor across a catalyst material to convert the at least one organic compound into carbon dioxide and water.

29. The apparatus of claim 27 wherein the means for oxidizing comprises means for passing the vapor across a catalyst material selected from the group consisting of gold, silver platinum, palladium, iridium, rhodium, mercury, ruthenium, osmium, and combinations thereof.

30. The apparatus of claim 27 further comprising means for collecting the vapor.

31. The apparatus of claim 30 wherein the means for collecting the vapor is at a heating station at or adjacent to the means for heating.

32. The apparatus of claim 30 wherein the means for collecting the vapor comprises at least one manifold.

33. The apparatus of claim 30 wherein the means for collecting the vapor is a blower or a fan.

34. The apparatus of claim 27 further comprising means for contacting the photosensitive element with a development medium to remove at least a portion of the liquefied material by the development medium.

35. The apparatus of claim 34 further comprising means for pressing the photosensitive element and the development medium into contact at a pressure sufficient for at least a portion of the liquefied material to be removed.

36. The apparatus of claim 34 further comprising means for separating the photosensitive element from the development medium.

37. The apparatus of claim 34 further comprising means for collecting the vapor at a heating station at or adjacent to the means for contacting with the development medium.

38. The apparatus of claim 27 further comprising:
means for supplying the development medium to an exterior surface of the composition layer;
means for supporting the photosensitive element, wherein at least one of the means for supplying and the means for supporting are movable relative to the other.

39. The apparatus of claim 38 wherein the composition layer has an exterior surface, and the means for heating is selected from the group consisting of:
a first heating means for applying heat to the exterior surface of the composition layer adjacent where a development medium contacts the layer;
a second heating means for heating the supplying means to a temperature capable of heating the exterior surface of the composition layer while the development medium is contacting the exterior surface of the layer;
a third heating means for heating the supporting means to a temperature capable of heating the exterior surface of the composition layer;
a combination of the first heating means and the second heating means;
a combination of the first heating means and the third heating means;
a combination of the second heating means and third heating means; and
a combination of the first heating means, the second heating means, and the third heating means.

40. The apparatus of claim 38 wherein the means for supplying the development medium comprises a roller mounted for rotation in a first frame portion.

41. The apparatus of claim 38 the means for supporting comprises a drum mounted for rotation in a second frame portion, the drum having an outer circumferential surface adapted to support the photosensitive element.

42. The apparatus of claim 27 wherein the means for oxidizing comprises:
an oxidation system assembly comprising a container, a means for heating the vapor in a first chamber of the container, and a means for transporting the vapor across a catalyst material in a second chamber of the container.

43. The apparatus of claim 42 wherein the means for heating the vapor is an electric coil.

44. The apparatus of claim 42 wherein the means for heating the vapor heats the vapor to a temperature between 150 and 650° C.

45. The apparatus of claim 42 wherein the means for heating the vapor heats the vapor to a temperature of at least 300° C.

46. The apparatus of claim 42 wherein the means for healing the vapor heats the vapor to a temperature of about 315 to 340° C. prior to oxidizing.

47. The apparatus of claim 42 wherein the means for transporting the vapor is a vacuum fan.

48. The apparatus of claim 27 wherein the means for oxidizing comprises: an oxidation container comprising a first chamber having an electric coil for heating the vapor, and a second chamber containing a catalyst material.

49. The apparatus of claim 27 wherein the purified air comprises at least carbon dioxide and water vapor.

50. The apparatus of claim 27 further comprising means for supplying all or a portion of the purified air to or adjacent to a heating station.

51. The apparatus of claim 27 further comprising means for maintaining the vapor at a temperature sufficient to keep the vapor in its vaporized state for oxidation.

52. The apparatus of claim 27 further comprising means for isolating the vapor at or adjacent to the means for heating the composition.

53. The apparatus of claim 52 wherein the means for isolating the vapor comprises one or more shrouds placed about a heating station.

54. The apparatus of claim 27 further comprising means for supplying air at or adjacent to a heating station.

55. The apparatus of claim 27 further comprising means for transporting the vapor to the means for oxidizing.

56. The apparatus of claim 27 further comprising means for transporting the vapor to the means for oxidizing, means for collecting the vapor, and means for isolating the vapor at a heating station.

57. The apparatus of claim 27 wherein the means for oxidizing is located internal to the apparatus.

58. The apparatus of claim 27 wherein the means for oxidizing is located external to the apparatus.

59. The apparatus of claim 58 further comprising means for maintaining the vapor in its vaporized state for entry to the means for oxidizing.

* * * * *